(12) United States Patent
Hanks

(10) Patent No.: US 6,462,605 B1
(45) Date of Patent: Oct. 8, 2002

(54) LOW-JITTER HIGH-POWER THYRISTOR ARRAY PULSE DRIVER AND GENERATOR

(75) Inventor: Roy L. Hanks, Byron, CA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 09/707,287

(22) Filed: Nov. 1, 2000

(51) Int. Cl.[7] ............................................. H03K 17/72
(52) U.S. Cl. ...................................... 327/438; 327/443
(58) Field of Search ................................ 327/374, 376, 327/377, 429, 438–443

(56) References Cited

U.S. PATENT DOCUMENTS 3,983,418 A * 9/1976 Wallace ...................... 327/109
5,304,875 A * 4/1994 Smith .......................... 327/109
5,740,022 A * 4/1998 Abe .............................. 363/39

* cited by examiner

*Primary Examiner*—Kenneth B. Wells
(74) *Attorney, Agent, or Firm*—William C. Daubenspeck; Paul A. Gottlieb

(57) ABSTRACT

A method and apparatus for generating low-jitter, high-voltage and high-current pulses for driving low impedance loads such as detonator fuses uses a MOSFET driver which, when triggered, discharges a high-voltage pre-charged capacitor into the primary of a toroidal current-multiplying transformer with multiple isolated secondary windings. The secondary outputs are suitable for driving an array of thyristors that discharge a precharged high-voltage capacitor and thus generating the required high-voltage and high-current pulse.

13 Claims, 5 Drawing Sheets

LOW-JITTER HIGH-POWER THYRISTOR ARRAY PULSE DRIVER AND GENERATOR

The United States Government has rights in this invention pursuant to Contract No. W-7405-ENG-48 between the United States Department of Energy and the University of California for Management of the Lawrence Livermore National Laboratory.

FIELD OF INVENTION

The invention relates to the field of high-current and high-voltage (i.e. high power) thyristor pulse drivers and generators such as used for explosive detonating firesets, cable and printed circuit board fault clearing, and for driving low impedance transducers and loads.

BACKGROUND OF THE INVENTION

The generation of high power electrical pulses is often required in various applications such as in the firesets used for detonating explosives. These firesets typically use one or more MOS (metal-oxide-semiconductor) controlled thyristors (MCTs) to drive an array of serial and/or parallel connected explosives. Controlled precision timing of detonation is desired in order to control the effect of the detonation of an array of explosives as well as for studying the details of how such explosive events unfold.

Some prior-art devices use sparkgap-based driver devices for discharging an energy storage capacitor for generating high power pulses. Others use CMOS or TTL transistors to directly drive one or more MCTs. These devices exhibit time-jitter and/or deteriorate rapidly when subjected to repeated use. The present invention corrects these prior-art problems.

BRIEF SUMMARY OF THE INVENTION

A low-jitter pulse-driver for driving a thyristor array and for producing a high-voltage and high-current output pulse from the thyristor array with fast rise-time and low onset jitter includes:

a) a trigger controlled low-voltage driver for driving a fast high-voltage switch;

b) a fast high-voltage switch for discharging a precharged capacitor into the primary of a current-multiplying transformer; and c) a current-multiplying transformer with its primary winding connected in series with the fast high-voltage switch and a precharged capacitor, the transformer having at least one electrically isolated secondary winding for outputting a fast rise-time electrical pulse suitable for driving one or more prescribed thyristors.

The low-jitter driver is suitable for many different applications requiring a high power input pulse with low time-jitter. A precharged capacitor is selected so that the energy stored in the capacitor produces the desired current pulse when discharged into the primary of the current-multiplier transformer and produces the required electrical pulse at the secondary output to drive a prescribed load, such as a thyristor.

One embodiment includes a high-voltage charging circuit for pre-charging the capacitor for providing the energy to drive the current-multiplying transformer.

Another embodiment includes a thyristor array for generating a high-voltage and high-current pulse with low-jitter, the thyristor array driven by multiple electrically isolated secondary windings of the current-multiplying transformer.

DETAILED DESCRIPTION OF THE INVENTION

Figure 1:
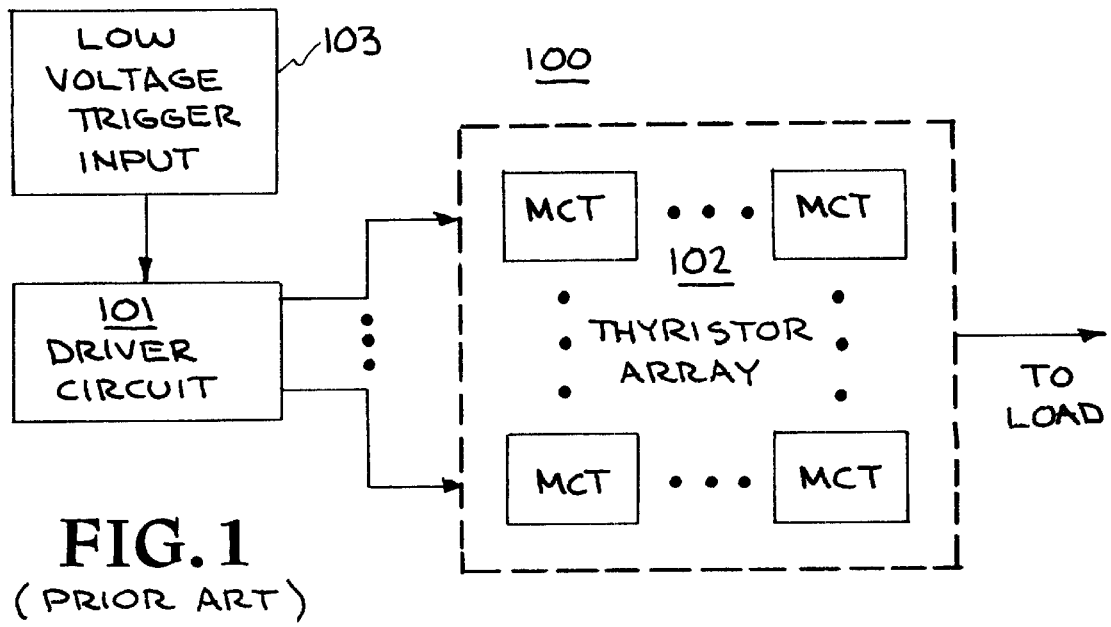
FIG. 1 is a block diagram of a prior-art thyristor driver circuit.

FIG. 1 is a block diagram of a prior-art thyristor array high-power pulse generator system 100. Driver circuit 101 is typically a set of one or more CMOS (complementary metal-oxide-semiconductor) or TTL (transistor-transistor-logic) power transistor circuits for driving one or more thyristors in thyristor array 102, the thyristor array providing a high current and voltage pulse to a fireset detonator load. A low-voltage input pulse at input terminal 103 initiates the circuit action. Alternatively, a suitable high-voltage driver circuit call be used to drive a triggered spark-gap switch. The spark-gap switch is used to discharge a precharged high-voltage capacitor for producing a high-voltage and high-current output pulse. However, spark-gap switches have proven to have low reliability and high jitter in the generated output pulse waveforms.

Figure 2:
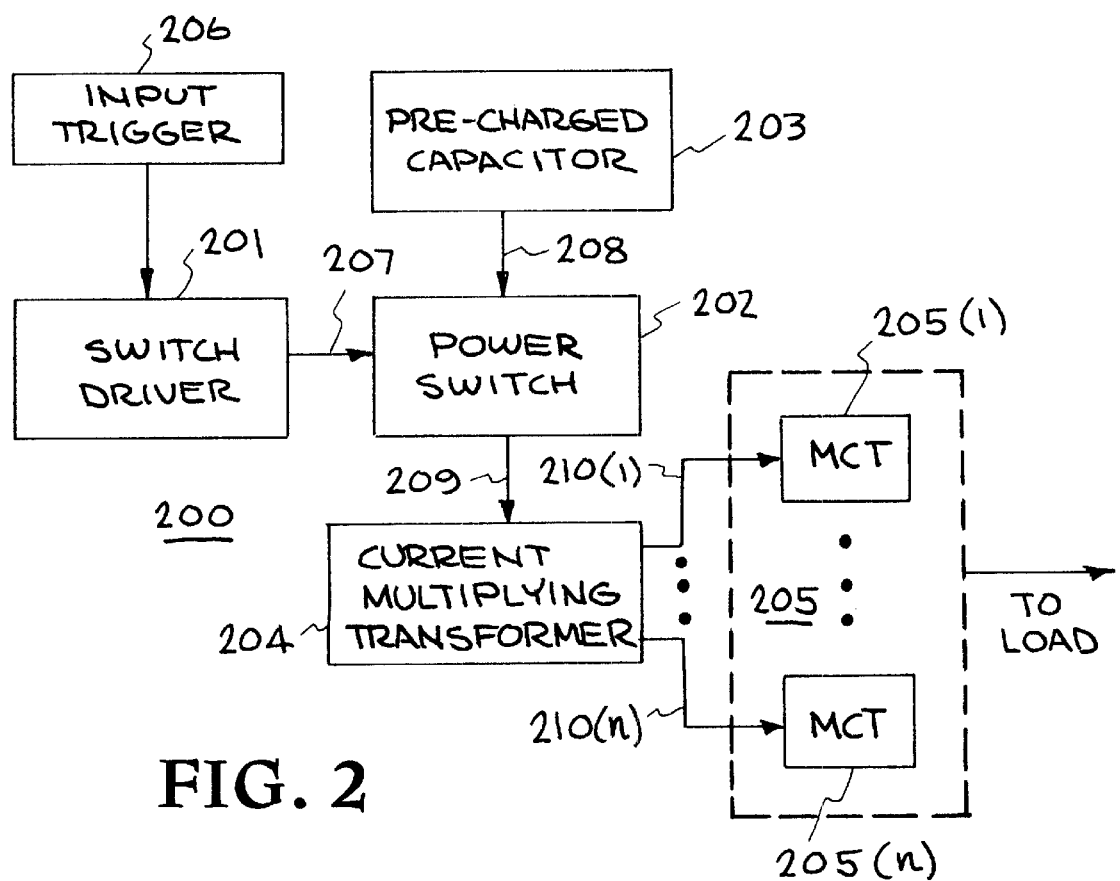
FIG. 2 is a block diagram of a low-jitter, high current, and high voltage, thyristor-array pulse driver.

FIG. 2 shows a block diagram of a low-jitter, high-current and high-voltage thyristor pulse generator system 200 which overcomes the shortcomings of the prior-art. Thyristor driver 201 accepts a low-voltage input trigger on input line 206 and produces a low-voltage output pulse to high-voltage power switch 202 on line 207 for switching-on power switch 202. When on, switch 202 is connected in series with precharged high-voltage capacitor 203 by line 208 and in series with the primary winding of current multiplying transformer 204 by means of line 209. This provides a conductive path for discharging precharged capacitor 203 through the primary winding of transformer 204 and produces a current-amplified pulse on each of the secondary output lines 210(1) . . . 210(n) for driving selected thyristor sub-arrays 205(1) . . . 205(n) in thyristor array 205. Each thyristor sub-array 205(k) may consist of one or more parallel thyristors for providing higher output current to their loads. Stacking sub-arrays in series generates a higher voltage output pulse.

Figure 3:
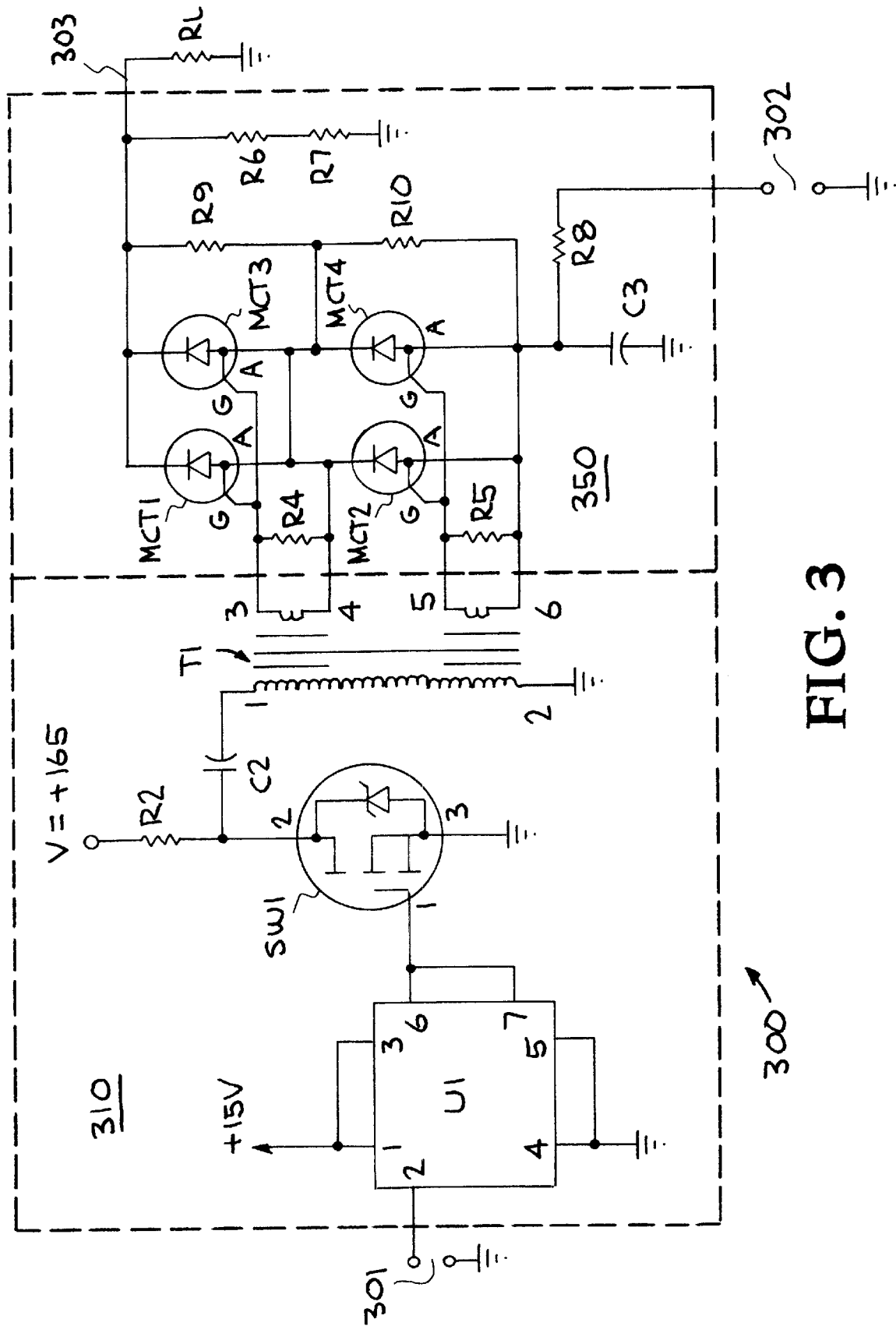
FIG. 3 is a circuit diagram of low-jitter, high current, and high voltage, thyristor pulse system including a driver circuit and thyristor array.
Figure 4A:
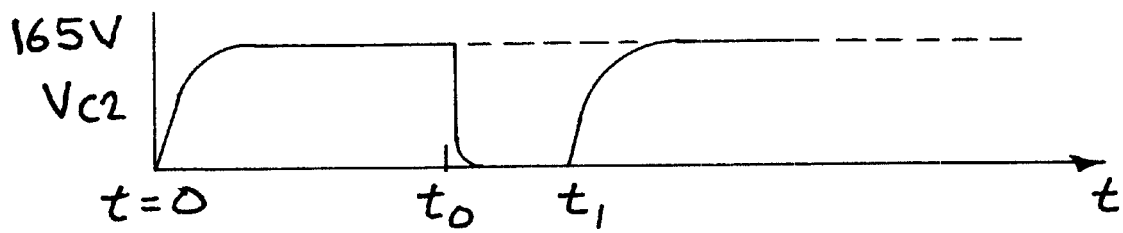
FIG. 4 shows a set of waveforms that demonstrate the operation of the circuit of FIG. 3.
Figure 4B:
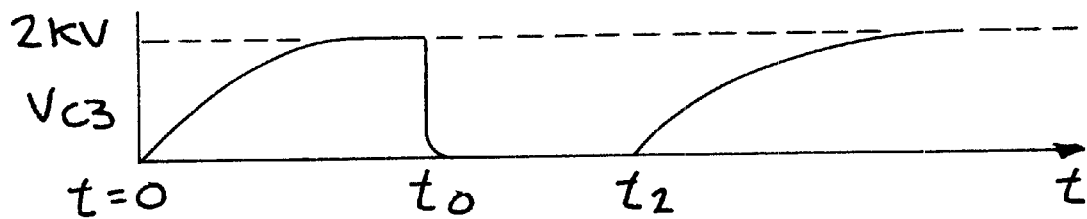
Figure 4C:
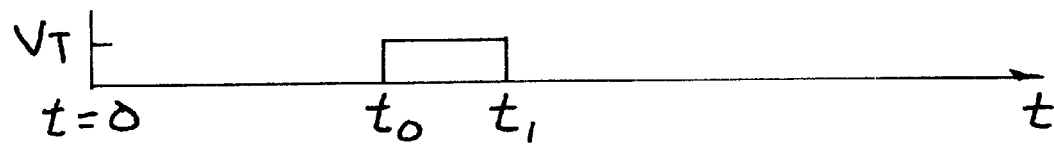
Figure 4D:
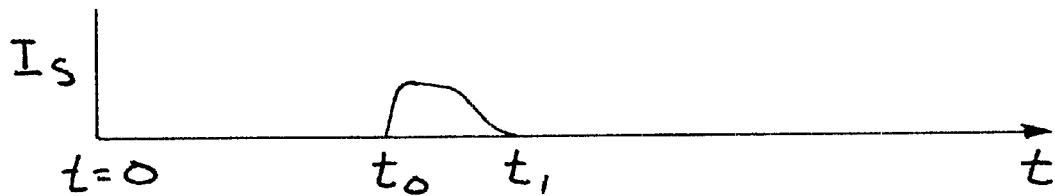
Figure 4E:
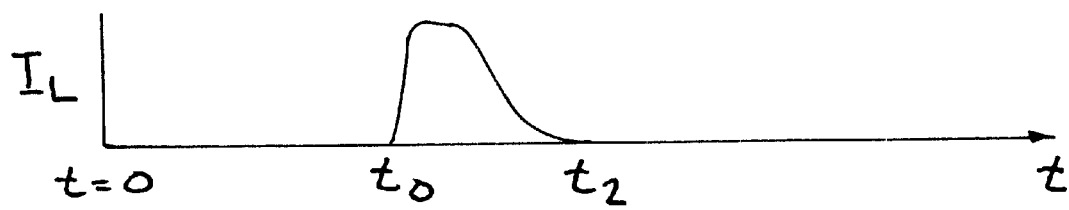

FIG. 3 is a circuit diagram of a low-jitter MOSFET-driven thyristor pulse generator system 300 that includes a preferred embodiment of a low-jitter pulse driver circuit 310 and a thyristor-array 350. A positive trigger, on input line 301, is applied to input terminal 2 of MOSFET driver unit U1. A suitable choice for driver unit U1 is the model MIC4452 MOSFET driver (manufactured by Micrel Semiconductor, 1849 Fortune Drive, San Jose, Calif. 951331) which is a fast non-inverting driver and accepts an input trigger level from 2.4 volts minimum to a maximum of $V_5$=15 volts (the supply voltage applied to terminals 1 and 5). The output level at pins 6 and 7 is within 25 mV of ground and $V_5$ for low and high logic levels, respectively. When an appropriate positive trigger level is applied to input line 301, driver U1 turns on n-channel MOSFET high-voltage switch SW1 by applying the output of terminals 6 and 7 to the control gate of SW1 at terminal 1. The drain terminal is connected to drain voltage supply $V_{dd}$ (+165 volts) through resistor R2, The preferred embodiment uses a model STW5NB100 high current and high speed switch manufactured by SGS-Thomson (STMicroelectronics, 1060 E. Brokaw Road, San Jose, Calif. 95131) which is capable of switching drain-to-source voltages up to 1 kV. Capacitor C2 of 0.01 uF has one side connected to the drain terminal 2 of SW1 and the other side to terminal 1 of the primary of current multiplying transformer T1. The source terminal 3 of SW1 and terminal 2 of the primary of T1 are both connected to common ground. The secondary of transformer T1 can have multiple independent (i.e. electrically isolated) secondary windings. The number of independent windings depends on the type of devices that are to be driven by the output of transformer T1 The current multiplying factor between the primary current and a secondary current is determined by the ratio of primary winding turns to secondary winding turns, For the preferred embodiment of FIG. 3, T1 is a toroidal transformer with a 10 ram primary and two isolated one-turn secondary windings for matching the requirements of the load represented by thyristor array 350.

Thus, when SW1 is not conducting from drain to source, capacitor C2 is precharged to the +165 volt supply voltage through resistor R2. But when SW1 is triggered into its conducting state by the positive trigger output of U1, the charge on C2 is discharged as a current pulse through SW1 and the primary of transformer T1.

Thyristor array 350 has two series-stacked sub-arrays of parallel-paired MOS-controlled thyristors, (MCT1, MCT2) and (MCT3, MCT4), for doubling the current and voltage capacity of the array output. The load that the thyristor-array 350 must drive determines the array size and configuration. In a preferred embodiment, MCT1 . . . MCT4 are model SMCT2TA65N14A10MCTs (manufactured by Silicon Power Corporation, Commercial Power Division, 3 Northway Lane North, Suite 1, Latham, N.Y. 12110–2204).

Referring back to FIG. 3, transformer T1 secondary output terminal pairs (3,4) and (5,6) of MOSFET driver 310 are respectively connected to the gate G and anode A of parallel thyristor pairs (MCT1, MCT3) and (MCT2, MCT4) for providing the required gating current to trigger the thyristor pairs into conduction. Resistors R4 and R5, connected across the secondary terminals (3,4) and (5,6) are dampening resistors for controlling overshoot of the current pulse leading edge, while resistors R9 and R10 ensure that the 2 kV charge across capacitor C3 is evenly split between the two series thyristor pairs (MCT1, MCT2) and (MCT3, MCT4). The thyristor array 350 high-voltage supply of 2 kV is applied to input terminal 302 for precharging capacitor C3 through resistor R8. Precharged capacitor C3 becomes the current source for the thyristor array when it is conducting. (N.B.: each application, with its own peculiar high-voltage and current requirement, will determine the thyristor array configuration.)

When MOSFET driver 310 is triggered, the two secondary windings produce a current pulse that drives thyristor array 350 into conduction and causes the precharged capacitor C3 to discharge through thyristors MCT1 . . . MCT4 and through output line 303 into the detonator load $R_L$. Conduction stops when the capacitor C3 is discharged because the current limited by resistor R8 is too small for sustained conduction of the thyristors.

Waveforms (a) . . . (e), shown in FIG. 4, summarize the operation of the circuit in FIG. 3 when driving a resistive load. Waveforms (a) and (b), from t=0 to t=$t_0$, show the charging voltage across capacitors C2 and C3, respectively, when the power supplies are turned on at t=0. At t=$t_0$, a positive trigger, $V_T$, is applied on trigger input line 301, and remains on for at least as much time as capacitor C2 requires to discharge as shown by waveform (c). Waveforms (d) and (e) respectively show the resulting discharge currents from capacitor C2 through transformer T1 and switch SW1, and from capacitor C3 through the thyristor array and output load $R_L$. After the trigger input is removed at time $t_1$ (waveform (c)), SW1 is turned-off and capacitor C2 recharges to 165 volts (waveform (a)). When the thyristor array stops conducting at t=$t_2$ in waveform (e), capacitor C3 begins to recharge through R8 to 2 KV, and the system is ready to be used again.

Figure 5:
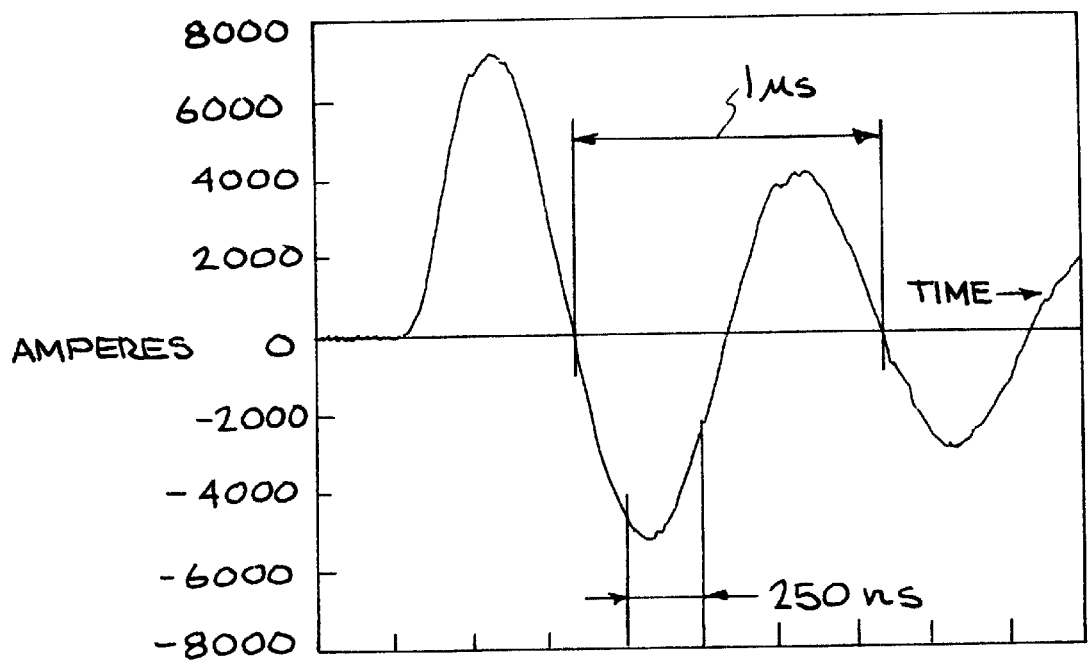
FIG. 5 is a typical current-waveform pulse produced by the thyristor-array driver circuit outputting into a short-circuit load.

A convenient way to test the MOSFET driven thyristor system of FIG. 3 is by short-circuiting output line 303 and observing the short-circuit output current when the input line 301 is triggered. The resulting short-circuit current waveform is shown in FIG. 5. This test, conducted with C3 having 0.5 uF capacitance, results in an output current-pulse having a damped sinusoidal-waveform due to the C3 discharge-path inductance and resistance. The approximately 1 us spacing between zero-crossings indicates a natural resonant frequency of about 1 MHz while the peak current exceeds 6000 amperes.

Figure 6:
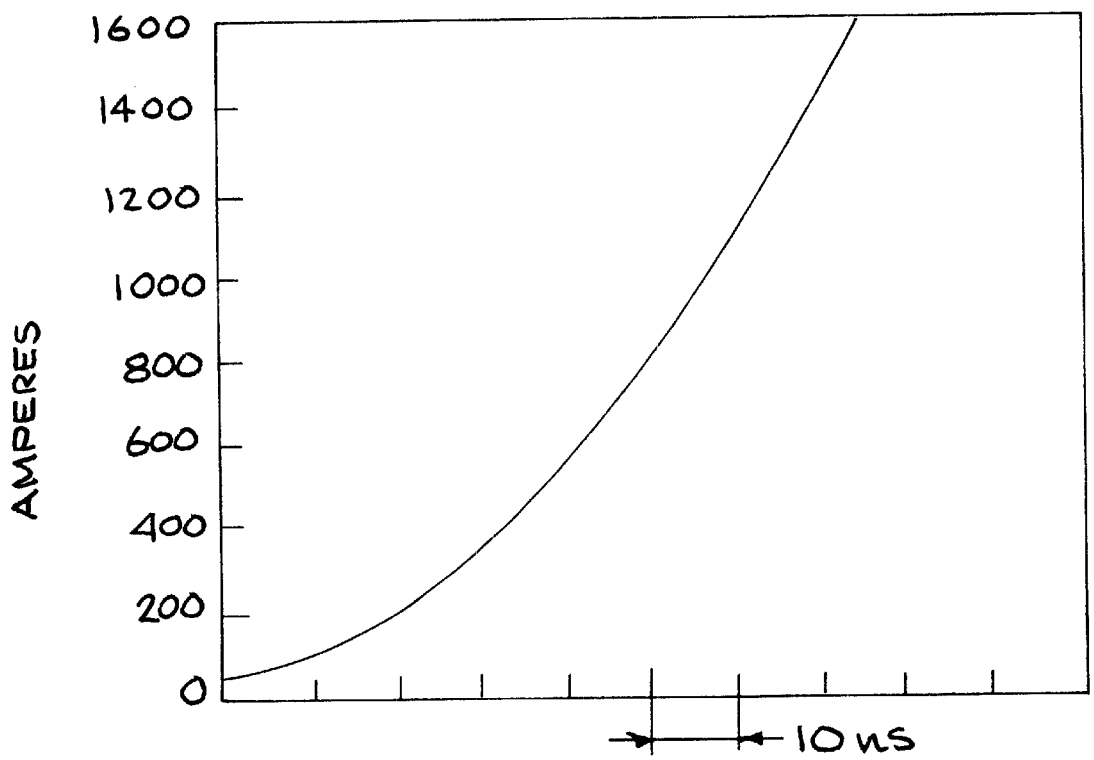
FIG. 6 shows a superposition of five output current-waveform pulses into a short circuit load with less than 1 ns of jitter.

The low-jitter characteristic of the previously described low-jitter MOSFET-driven thyristor system is demonstrated in FIG. 6 where the early onset portion of the short-circuit current waveform is shown expanded and the superposed current waveforms from five successive firings of the low-jitter MOSFET-driven thyristor system are shown. Examination of the spread between traces indicates that the jitter of the output short-circuit current waveforms is less than 1 nS.

Figure 7:
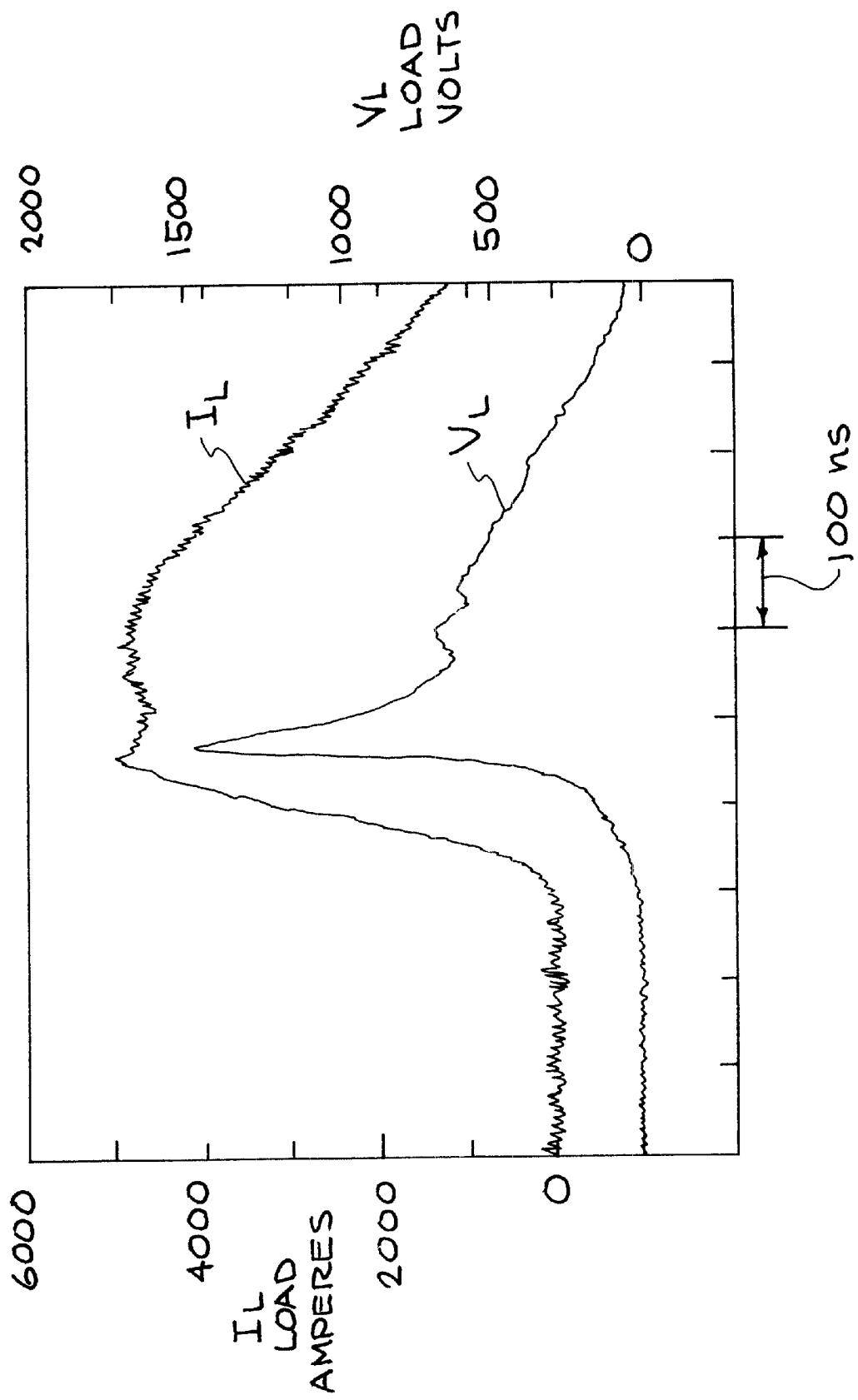
FIG. 7 shows a typical thyristor output voltage-pulse and current-pulse waveforms into a detonator load.

FIG. 7 shows another example of the low-jitter MOSFET-driven thyristor system output load-current, $I_L$, and load-voltage, $V_L$, waveforms for the case when capacitor C3 of FIG. 3 has a value of 0.82 uF and the load is a typical exploding bridgewire (EBW) or slapper detonator. Load current, $I_L$, rises to a peak-plateau of almost 5000 amperes and eventually drops-off after about 280 nS. The load voltage peaks and drops-off more sharply after exceeding 1500 volts.

The present invention has been described in terms of specific embodiments, which are illustrative of the invention, and are not to be construed as limiting.

What is claimed is:

1. A pulse generator comprising:
    a) a first capacitor having a first and second plate for storing an electrical charge;
    b) a current multiplying transformer having a primary winding and a secondary winding, the primary winding having a first and a second terminal, the first terminal connected to the first capacitor plate;
    c) an electronically activated switch having a first and a second terminal that are connected when the switch is activated, the first terminal connected to the second capacitor plate, the second terminal commented to the transformer primary second terminal for discharging the capacitor through the transformer primary winding and producing a low-jitter output pulse at the transformer secondary winding output;

d) a second capacitor for storing a charge; and e) a thyristor switch with its trigger input connected to the transformer secondary winding for controlling the thyristor switch conducting state, and second capacitor discharging through the thyristor for delivering a pulse to an output load when the thyristor switch is conducting.

2. A pulse generator as recited in claim 1 further comprising a charging circuit for charging the first capacitor.

3. A pulse generator as recited in claim 1 wherein the transformer has more than one isolated secondary windings for driving an array of thyristors, and the thyristor switch is an array of thyristor switches configured to generate an output pulse.

4. A pulse generator as recited in claim 1 further comprising a buffer amplifier for accepting a trigger signal and delivering an output signal for controlling the electronically activated switch.

5. A method for generating a pulse from at least one thyristor, the method comprising:

a) charging a first capacitor with a prescribed charge for creating a current and voltage pulse when discharged;

b) charging a second capacitor with a charge for producing an output pulse when discharged;

c) discharging the first capacitor by means of an electronic switch into the primary winding of a current multiplying transformer with at least one electrically isolated secondary winding, for producing a pulse on each of the transformer isolated secondary windings; and d) triggering at least one thyristor into conduction by using the transformer isolated secondary windings and discharging the second capacitor through said at least one thyristor for producing an output pulse into a load.

6. A method for generating a low-jitter pulse for driving a thyristor array, comprising:

c) charging a capacitor with a prescribed charge for creating a current and voltage pulse when discharged; and d) discharging the capacitor by means of an electronic switch into the primary winding of a current multiplying transformer with at least one electrically isolated secondary winding for producing a set of pulses, one on each of the transformer isolated secondary windings, for driving a thyristor array.

7. A pulse generator comprising:

a) an electronically activated switch;

b) a first capacitor;

c) a first power supply for charging said first capacitor; said first capacitor being charged when said electronically activated switch is unactivated;

d) at least one thyristor switch; and e) a current multiplying transformer having a primary winding connected in series with said first capacitor and said electronically activated switch, said first capacitor being discharged through the primary winding of the transformer when said electronically activated switch is activated, said current multiplying transformer having at least one secondary winding, each secondary winding being coupled to drive at least one of said at least one thyristor switch into conduction when said first capacitor is discharged through said primary winding.

8. A pulse generator as recited in claim 7 further comprising:

a) a second capacitor; and b) a second power supply for precharging said second capacitor; said second capacitor being discharged through said at least one thyristor switch when said at least one thyristor switch is driven into conduction to provide an output pulse.

9. A pulse generator as arecited in claim 8 wherein:

a) said at least one thyristor switch is a thyristor switch array having at least two thyristor switches, and wherein b) each secondary winding is coupled to drive at least one of said at least two thyristor switches in the thyristor switch array into conduction when said first capacitor is discharged through said primary winding; and wherein c) said second capacitor is discharged through said thyristor switch array when said thyristor switches are driven into conduction.

10. A pulse generator as recited in claim 9 wherein:

a) each secondary winding is coupled to drive two or more thyristor switches of said thyristor switch array into conduction when said first capacitor is discharged through said primary winding.

11. A pulse generator as recited in claim 10 wherein:

a) at least one of said two or more thyristor switches driven by a secondary winding is coupled to conduct in series with at least one of said two or more thyristor switches driven by another of said secondary windings.

12. A pulse generator as recited in claim 10 wherein:

a) each of said two or more thyristors driven into conduction by each of said secondary windings is coupled to conduct in series with corresponding thyristor switches which are driven into conduction by each of said other secondary windings.

13. A pulse generator as recited in claim 7 further comprising means for activating said electronically activated switch.

* * * * *